United States Patent [19]
Sasaki et al.

[11] Patent Number: 5,220,585
[45] Date of Patent: Jun. 15, 1993

[54] SERIAL CLOCK GENERATING CIRCUIT

[75] Inventors: Takayoshi Sasaki; Tsuyoshi Katayose, both of Tokyo, Japan

[73] Assignee: NEC Corporation, Tokyo, Japan

[21] Appl. No.: 832,867

[22] Filed: Feb. 6, 1992

[30] Foreign Application Priority Data

Feb. 7, 1991 [JP] Japan .................................. 3-16219

[51] Int. Cl.⁵ ............................................. H04L 7/00
[52] U.S. Cl. .................................... 375/106; 328/141
[58] Field of Search ............. 375/106, 118, 119, 120; 370/108; 360/51; 328/141, 72, 134, 155

[56] References Cited

U.S. PATENT DOCUMENTS

| | | | |
|---|---|---|---|
| 4,896,337 | 1/1990 | Bushy, Jr. ............................ | 375/118 |
| 4,931,986 | 6/1990 | Daniel et al. ........................ | 370/108 |
| 5,056,120 | 10/1991 | Taniguchi et al. .................. | 307/510 |

*Primary Examiner*—Stephen Chin
*Attorney, Agent, or Firm*—Whitham & Marhoefer

[57] ABSTRACT

A serial clock generating circuit is configured to frequency-divide an input clock having a frequency which is a number times a serial data transfer rate, so as to generate a serial clock in phase with a received serial data. The serial clock generating circuit comprises an edge detection circuit for detecting a level change of a received serial data so as to generate a level change signal. Three registers stores different set values, and a latch latches one of the different set values. A decrementer decrements the value of the latch in response to each input clock, and a memory circuit holds an arbitrary value for defining a phase deviation discrimination area. A comparison circuit compares the value stored in the memory circuit with the value of the latch at each one input clock, and generates a coincidence signal when a coincidence is obtained. An area detection circuit discriminates a level change position on the basis of the level change signal and the coincidence signal and selects one of the registers to be set to the latch. A flipflop is coupled to the decrementer for generating a serial clock on the basis of the result of the counting of the decrementer.

5 Claims, 4 Drawing Sheets

SERIAL CLOCK GENERATING CIRCUIT

BACKGROUND OF THE INVENTION

1. Field of the Invention

The present invention relates to a serial clock generator, and more specifically to a serial clock generating circuit for use in a serial data transfer circuit included in data processing systems including microcomputers, which serial clock generating circuit can comply with a case in which a level of a serial data transfer signal line changes in a predetermined period of time.

2. Description of Related Art

Conventionally, a serial data transfer circuit, which is one of various peripheral hardwares of data processing systems, has been widely used in comparison with a parallel data transfer circuit utilizing a bus connection, because the number of signal lines required for data transfer is small and therefore is economic, and because of other reasons.

On the other hand, data processing systems have been required to communicate with various peripheral devices and other data processing systems. However, a serial transfer rate or frequency being used is different dependently upon the devices and the systems coupled to the data processing system. Therefore, a serial data transfer circuit included in the data processing systems has been desired to easily deal with serial transfer frequencies of a wide extent, for example by a software processing with a central processing unit.

In a data transfer system for sending and receiving serial data, particularly, in a serial transfer system does not receive a serial clock for synchronizing receipt of the transfer data, a receiving side of the serial data transfer is required to have a circuit for generating a serial clock for receiving a transmitted data.

The serial clock generating circuit provided at the receiving side of the serial data transfer has been adapted to prepare an internal count clock having a frequency N times (for example, 16 times or 32 times) of a serial transfer rate which is previously determined between a sending side and the receiving side. The internal count clock is frequency-divided so as to generate an internal serial clock having the same period as that of the serial transfer rate. In addition, the generated receiving side serial clock is phase-adjusted to become in phase with a sending side serial clock signal, by changing a frequency division rate of the internal clock.

This phase-matching of the receiving side serial clock with the received serial data is ceaselessly performed at each signal level transition on a serial data transfer signal line. The reason for this is that even if the phase-matching has been realized at once, a phase-mismatching will occur between a serial clock of the sending side and a serial clock of the receiving side due to various causes such as a delay of a transfer path and a change of temperature of environment.

In brief, conventional serial clock generating circuits are basically constructed such that a clock generator generates an internal count clock, which is counted by an binary counter, so that a frequency divided clock is generated by the binary counter as an internal serial clock. A timing of clearing the binary counter is controlled or adjusted by detecting an edge or transition of the received serial data, so that the generated internal serial clock phase-adjusted to become in phase with the sending side serial clock signal. However, the binary counter has a fixed length, and therefore, if the internal count clock has a fixed frequency, the generated internal serial clock also have a fixed frequency.

Therefore, in case of requiring to realize a plurality of serial data transfers having different transfer frequencies by using the conventional serial clock generating circuit, one method is to provide a plurality of quartz-crystal oscillators and to select an appropriate one from the plurality of quartz-crystal oscillators by means of software processing so that a desired count clock is supplied to the serial clock generating circuit. However, the provision of the plurality of quartz-crystal oscillators will results in an increased number of parts in an application system, and hence, in an increased cost of the application system.

Another method is to use a frequency-division circuit which is provided independently of the serial clock generating circuit and which is connected to receive and frequency-divide a clock generated by a single quartz-crystal oscillator so as to supply a count clock having any selected frequency. In this case, since the frequency-dividing circuit is ordinarily composed of a binary counter, a quartz-crystal oscillator must be used which has an oscillation frequency as high as possible, in order to ensure that the serial clock generating circuit can generate a plurality of serial clocks having arbitrary different frequencies without decreasing a resolution of the serial clock generating circuit. However, it can ordinarily be said that the higher the oscillation frequency becomes, the more the quartz-crystal oscillator becomes expensive, and the larger the power consumption of the circuit becomes.

In addition, a modification is not so easy which makes it possible to change the bit length and the number of counts in a software manner. Furthermore, it is in some case that peripheral instruments and apparatuses coupled to the data processing system including therein the serial clock generating circuit are different in the magnitude or degree of minute change of the serial transfer frequency. In this case, it is required to change a modification value for eliminating a phase deviation between the received serial data and the receiving side serial clock, but it is not so easy.

SUMMARY OF THE INVENTION

Accordingly, it is an object of the present invention to provide a serial clock generating circuit which has overcome the above mentioned defect of the conventional one.

Another object of the present invention is to provide a serial clock generating circuit capable of generating an internal serial clock corresponding to an arbitrary transfer rate, and also capable of setting an arbitrary modification value.

The above and other objects of the present invention are achieved in accordance with the present invention by a serial clock generating circuit configured to frequency-divide an input clock having a frequency which is a number times a serial data transfer rate, so as to generate a serial clock in phase with a received serial data, the serial clock generating circuit comprising means receiving a serial data for detecting a level change of the received serial data and generating a level change signal, first memory means for storing a plurality of set values, means connected to the first memory means for selecting one of the plurality of set values, means receiving the set value selected by the selecting means for counting the selected set value by the input clock, second memory means for storing an arbitrary value, comparison means for comparing the value stored in the second memory means with a count value of the count means at each one counting operation of the input clock, the comparison means generating a coincidence signal when a coincidence is obtained, means for discriminating a level change position on the basis of the level change signal and the coincidence signal and for setting a selection condition of the selection means, and means for generating a serial clock on the basis of the result of the counting of the count means.

The above and other objects, features and advantages of the present invention will be apparent from the following description of preferred embodiments of the invention with reference to the accompanying drawings.

DESCRIPTION OF THE PREFERRED EMBODIMENTS

The following is a detailed description of embodiments of the serial clock generating circuit in accordance with the present invention. However, a transfer control procedures used for a data transfer will be not explained for simplification of the description.

Figure 1:
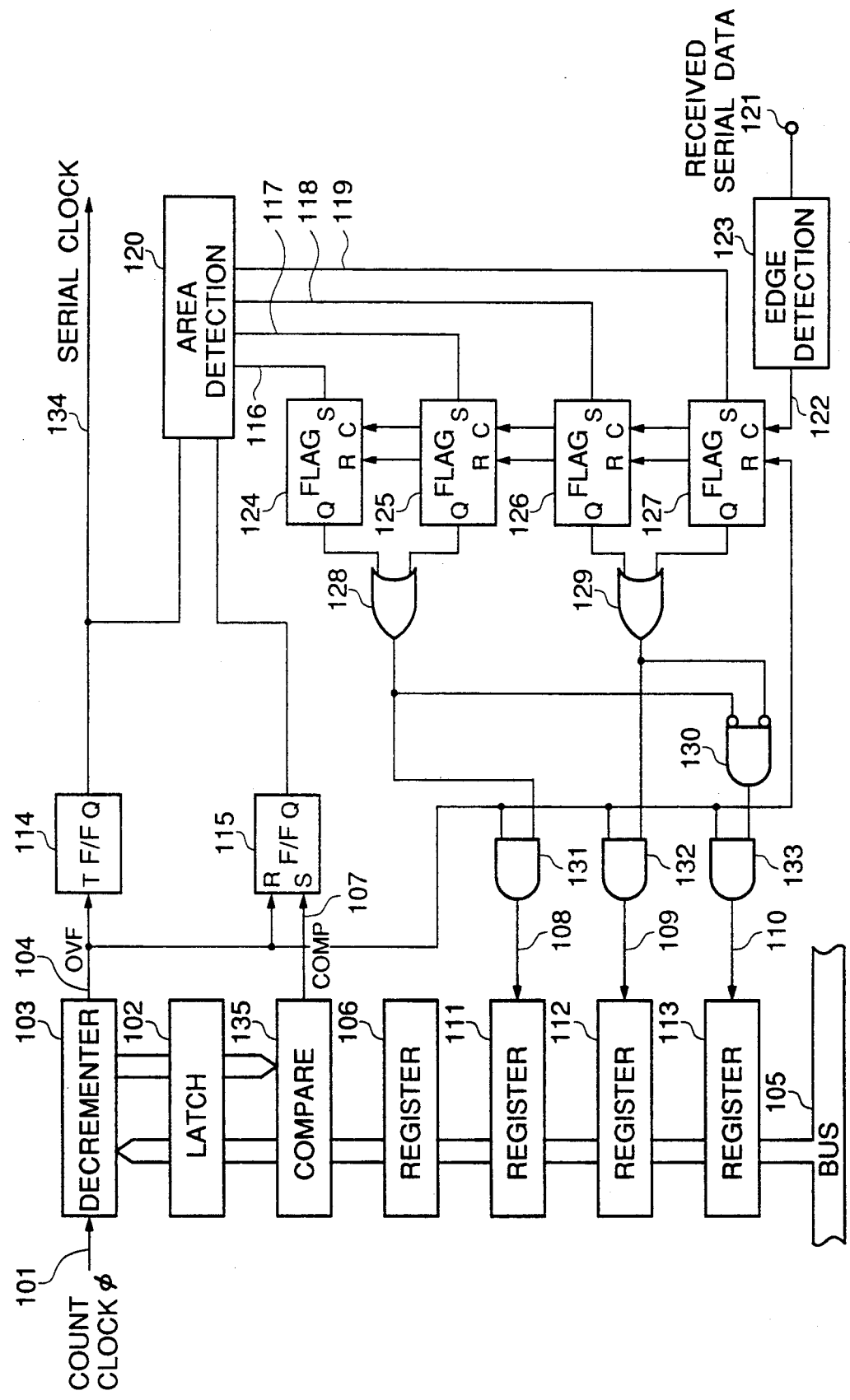
FIG. 1 is a block diagram of a first embodiment of the serial clock generating circuit in accordance with the present invention.

Referring to FIG. 1, there is shown a diagram of a first embodiment of the serial clock generating circuit in accordance with the present invention.

The shown serial clock generating circuit comprises a decrementer 103 of four bits coupled to a latch 102 for decrementing a content of the latch 102 in response to each count clock $\phi$, 101, and for generating an overflow signal 104 (called a "OVF signal" hereinafter) when the content of the latch 102 becomes "0". A register 106 of four bits is provided, which can be set with an arbitrary value through a bus 105 from an external (not shown). A compare circuit 135 is provided to compare a set value of the register 106 with the value of the latch 102 and to generate a coincidence signal 107 (called a "COMP signal" hereinafter) when the set value of the register 106 is coincident with the value of the latch 102.

In addition, there are provided three registers 111, 112 and 113 of four bits, which are set through the bus 105 from an external (not shown), respectively, and which transfer and set their set value to the latch 102 in response to a set instruction signal 108, 109 or 110, respectively. A flipflop (F/F) 114 receives the OVF signal and performs a toggle operation in response to the OVF signal so as to generate a serial clock 134. Another flipflop (F/F) 115 is set with the COMP signal 107 and reset with OVF signal 104. An output of the flipflops 114 and 115 is connected to an area detection circuit 120. This area detection circuit 120 brings its first detection signal 116 into "1" when the serial clock 134 is at "1" and the Q output of the flipflop 115 is at "0", and also brings its second detection signal 117 into "1" when the serial clock 134 is at "1" and the Q output of the flipflop 115 is at "1". In addition, when the serial clock 134 is at "0" and the Q output of the flipflop 115 is at "0", the area detection circuit 120 brings its third detection signal 118 into "1", and when the serial clock 134 is at "0" and the Q output of the flipflop 115 is at "1", the area detection circuit 120 brings its fourth detection signal 118 into "1".

The shown serial clock generating circuit also includes an edge detector 123 receiving a received serial data 121 for detecting a level change of the received serial data 121 so as to generating an edge detection signal 122. A flag 124 receiving the detection signal 116 is set in synchronism to the edge detection signal 122, and is reset in response to the OVF signal 104. A flag 125 receiving the detection signal 117 is set in synchronism to the edge detection signal 122, and is reset by counting the OVF signal 104 two times. A flag 126 receiving the detection signal 118 is also set in synchronism to the edge detection signal 122, and is reset by counting the OVF signal 104 two times. A flag 127 receiving the detection signal 119 is set in synchronism to the edge detection signal 122, and is reset in response to the OVF signal 104. Outputs of the flags 124 and 125 are inputted to an OR gate 128, and outputs of the flags 126 and 127 are inputted to an OR gate 129. Outputs of these OR gates are inputted to an AND gate 120, which generates an output signal of "1" when the output of the OR gate 128 is at "0" and the output of the OR gate 129 is at "0". An AND gate 131 receives the output of the OR gate 128 and the OVF signal 104 so as to output an logical product signal as the set instruction signal 108, and an AND gate 132 receives the output of the OR gate 129 and the OVF signal 104 so as to output an logical product signal as the set instruction signal 109. An AND gate 133 receives the output of the AND gate 130 and the OVF signal 104 so as to output an logical product signal as the set instruction signal 110.

The registers 106, 111, 112 and 113 can be set with any value through the bus 105 in a software manner controlled by a CPU (central processing unit) (not shown) in a microcomputer of a data processing system including therein the serial clock generating circuit of the present embodiment.

The register 113 is set with a value which makes a frequency of the generated serial clock 134 consistent with a transfer frequency of the received serial data 121. Here, assuming that a data transfer period of the received serial data 121 is 16 times the period of the count clock $\phi$ 101, the value to be set in the register 113 is "7" in accordance with the following equation:

$$\{(\text{transfer rate})/2 \cdot (\text{count clock frequency})\} - 1 = (16\phi/2\phi) - 1 = 7$$

The register 111 is set with a value for prolonging the period of the serial clock 134 when the serial clock 134 and the received serial data 121 are out of phase. In this embodiment, "8" is set to the register 111.

The register 113 is set with a value for shortening the period of the serial clock 134 when the serial clock 134 and the received serial data 121 are out of phase. In this embodiment, "6" is set to the register 112.

The register 106 is set with a value for setting a phase deviation discrimination area in order to determine a correction amount suitable for the occurred phase deviation when the phase deviation between the serial clock 134 and the received serial data 121 is detected. In this embodiment, "3" is set to the register 106.

Figure 2:
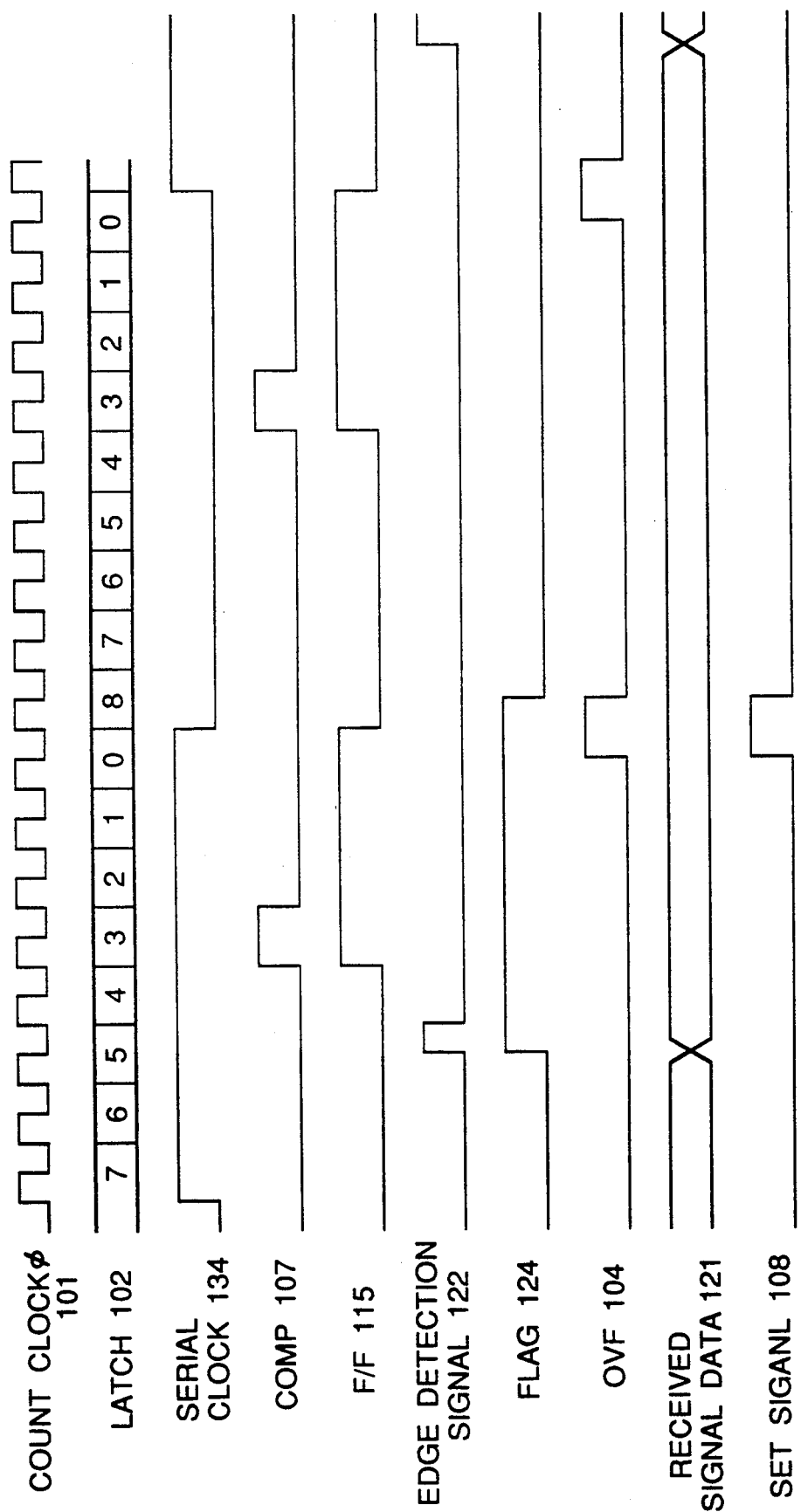
FIG. 2 is a timing chart illustrating the operation of the serial clock generating circuit shown in FIG. 1.

Now, operation will be explained with reference to FIG. 2. First, assume that the latch 102 is set with the value ("7") of the register 113, and the output of the flipflop 114 is at "1" and the output of the flipflop 115 is at "0". The decrementer 103 operates to subtract the content of the latch 102 by "1" (namely, addition of "−1") when the count clock φ 101 is at "0", and to write the result of subtraction into the latch 102 when the count clock φ 101 is at "1".

Thus, the decrementer 103 continues to decrement the content of the latch 102 from the set value "7" in response to each count clock φ 101. When the content of the latch 102 becomes coincident with the set value "3" of the register 106, in synchronism with "1" (rising edge) of the count clock φ 101 the compare circuit 135 generates the COMP signal 107 of "1" for a period corresponding to one period of the count clock φ 101. As a result, the flipflop 115 is set in response to the COMP signal 107 of "1".

The decrementer 103 further continues to decrement the content of the latch 102. When the content of the latch 102 becomes "0", in synchronism with "0" (falling edge) of the count clock φ 101 the decrementer 103 generates the OVF signal 104 of "1" for a period corresponding to one period of the count clock φ 101.

In synchronism with "1" (rising edge) of the count clock φ 101, the OVF signal 104 resets the flipflop 114 so that the serial clock 134 is brought to "0". Until this timing, the serial clock 134 is outputted a half period.

Furthermore, in synchronism with "1" (rising edge) of the count clock φ 101, the OVF signal 104 resets the flipflop 115.

As will be understood, during a period in which the content of the latch 102 is from "7" to "4", the area detection circuit 120 brings the first detection signal 116 to "1".

Here, assuming that when the content of the latch 102 is "5", the received serial data 121 changes, the edge detection circuit 123 generates the edge detection signal 122 of "1" for a period corresponding to one "0" period of the count clock φ 101. At this time, since the first detection signal 116 is "1", the flag 124 is set with "1" in response to the edge detection signal 122. On the other hand, the other flags 125, 126 and 127 are not set.

As mentioned above, when the decrementer 103 brings the content of the latch 102 into "0", since the flag 124 is at "1", the output of the gate 128 is "1" and therefore, the AND gate 131 outputs "1" in response to the OVF signal 104, so that the set instruction signal 108 is brought into "1" at the same timing as the OVF signal 104. Thus, when the count clock φ 101 is at "1", the latch 102 is set with the value "8" of the register 111 in response to the set instruction signal 108.

Also as mentioned above, the OVF signal 104 of "1" resets the flipflop 114 so that the serial clock 134 is brought to "0". In addition, the flag 124 is reset in response to the falling edge of the flag 124.

Thus, since the latch 102 is set with "8", a next half period of the serial clock, namely, the period of "0" in the serial clock 134 has a length of nine clocks of the count clock φ 101. Namely, one period of the serial clock 135 becomes 17 clocks of the count clock φ 101.

The above mentioned operation is applied to the case in which the transition of the received serial data 121 occurs when the serial clock 134 is at "1" and the content of the latch 102 is "5". However, if the transition of the received serial data 121 occurs when the serial clock 134 is at "1" and the content of the latch 102 is in the range of "7" to "4" inclusive, one period of the serial clock 135 similarly becomes 17 clocks of the count clock φ 101. Accordingly, the phase deviation between the received serial data 121 and the serial clock 134 is corrected by one clock of the serial clock φ 101.

Figure 3:
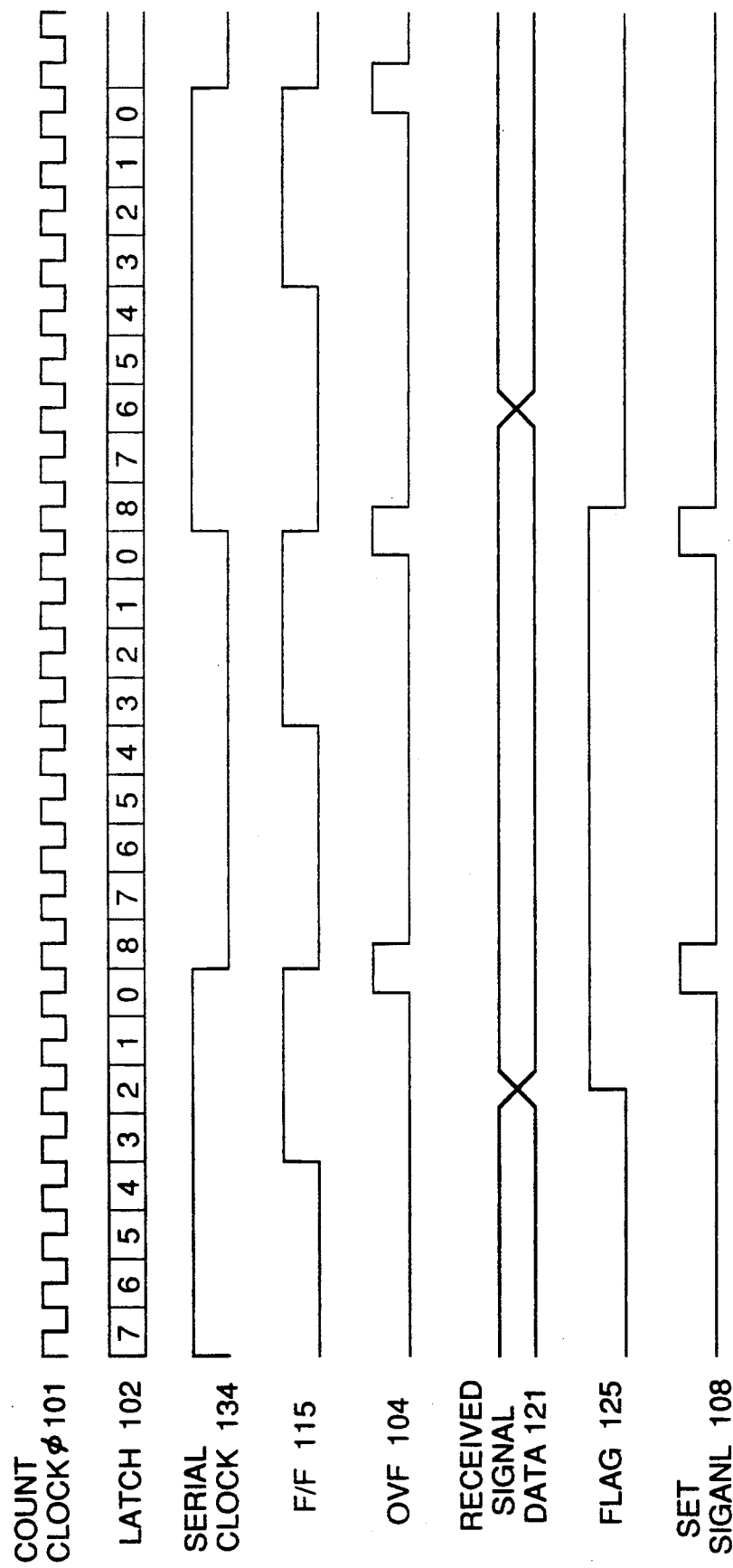
FIG. 3 is another timing chart illustrating the operation of the serial clock generating circuit shown in FIG. 1.

Next, with reference to FIG. 3, operation will be explained about a case in which the transition of the received serial data 121 occurs when the serial clock 134 is at "1" and the content of the latch 102 is in the range of "3" to "0" inclusive. In this connection, since the initial value of the latch 102 and the initial state of the flipflops are the same as the above mentioned example of operation, explanation thereof will be omitted.

Assume that the transition of the received serial data 121 occurs when the serial clock 134 is at "1" and the content of the latch 102 is at "2". The flipflop 115 is set when the content of the latch 102 is "3". On the other hand, when the edge detection signal 122 is generated, the second detection signal 117 outputted from the area detection signal 120 is "1", and therefore, the flag 125 is set. Thereafter, the decrementer 103 continues to decrement the content of the latch 102, and when it reaches "0", the OVF signal 104 is generated.

This OVF signal 104 resets the flipflop 114, so that the serial clock 134 is brought to "0". Since the flag 125 is "1", the output of the gate 128 is "1" and therefore, the AND gate 131 outputs "1" in response to the OVF signal 104, so that the set instruction signal 108 is brought into "1" at the same timing as the OVF signal 104. Thus, the latch 102 is set with the value "8" of the register 111 in response to the set instruction signal 108.

As mentioned hereinbefore, since the flag 125 is reset with two rising edges of the OVF signals 104, the flag 125 is maintained in the set condition at this time. Therefore, the decrementer 103 continues to decrement from the value "8", and when it reaches "0", the OVF signal 104 is generated. The flag 125 is maintained in the set condition, since the received serial data remains unchanged. Therefore, the output of the gate 128 is "1" and the AND gate 131 outputs "1" in response to the OVF signal 104, so that the set instruction signal 108 is brought into "1" at the same timing as the OVF signal 104. Thus, the latch 102 is set with the value "8" of the register 111, again.

On the other hand, the flipflop 114 is set in response to the OVF signal 104, so that the serial clock 134 is brought to "1". Since the rising edge of the OVF signal 104 occurs two times, the flag 125 is reset. Thereafter, the decrementer 103 continues to decrement, and when it reaches "0", the decrementer 103 generates the OVF signal 104 so that the flipflop 114 is reset and the serial clock 134 is brought to "0".

As seen from the above, the decrementer 103 counts "8" two times, and therefore, the period of the serial clock 134 has a length corresponding to 18 clocks of the count clock φ 101. Accordingly, the phase deviation between the received serial data 121 and the serial clock 134 is corrected by two clocks of the count clock φ 121.

Now, operation will be explained about a case in which the transition of the received serial data 121 occurs when the serial clock 134 is at "0" and the content of the latch 102 is in the range of "7" to "4" inclusive.

First, assume that the transition of the received serial data 121 occurs when the serial clock 134 is at "0" and the content of the latch 102 is at "6". The flipflop 115 is in a reset condition when the content of the latch 102 is "6". Therefore, when the edge detection signal 122 is generated, the third detection signal 118 outputted from the area detection signal 120 is "1", and therefore, the flag 126 is set. Thereafter, the decrementer 103 continues to decrement the content of the latch 102, and when it reaches "0", the OVF signal 104 is generated.

This OVF signal 104 resets the flipflop 114, so that the serial clock 134 is brought to "1". Since the flag 126 is "1", the output of the gate 129 is "1" and therefore, the AND gate 132 outputs "1" in response to the OVF signal 104, so that the set instruction signal 109 is brought into "1" at the same timing as the OVF signal 104. Thus, the latch 102 is set with the value "6" of the register 112 in response to the set instruction signal 109.

As mentioned hereinbefore, since the flag 126 is reset with two falling edges of the OVF signals 104, the flag 126 is maintained in the set condition at this time. Therefore, the decrementer 103 continues to decrement from the value "6", and when it reaches "0", the OVF signal 104 is generated. The flag 126 is maintained in the set condition, since the received serial data remains unchanged. Therefore, the output of the gate 129 is "1" and the AND gate 132 outputs "1" in response to the OVF signal 104, so that the set instruction signal 109 is brought into "1" at the same timing as the OVF signal 104. Thus, the latch 102 is set with the value "6" of the register 112, again.

On the other hand, the flipflop 114 is reset in response to the OVF signal 104, so that the serial clock 134 is brought to "0". Since the rising edge of the OVF signal 104 occurs two times, the flag 126 is reset. Thereafter, the decrementer 103 continues to decrement, and when it reaches "0", the decrementer 103 generates the OVF signal 104 so that the flipflop 114 is set and the serial clock 134 is brought to "1".

As seen from the above, the decrementer 103 counts "6" two times, and therefore, the period of the serial clock 134 has a length corresponding to 14 clocks of the count clock φ 101. Accordingly, the phase deviation between the received serial data 121 and the serial clock 134 is corrected by two clocks of the count clock φ 121.

In addition, operation will be explained about a case in which the transition of the received serial data 121 occurs when the serial clock 134 is at "0" and the content of the latch 102 is in the range of "3" to "0" inclusive.

First, assume that the transition of the received serial data 121 occurs when the serial clock 134 is at "0" and the content of the latch 102 is at "2". The flipflop 115 is set when the content of the latch 102 is "3". Thereafter, when the edge detection signal 122 is generated, the third detection signal 120 is "1", and therefore, the flag 127 is set. Thereafter, the decrementer 103 continues to decrement the content of the latch 102, and when it reaches "0", the OVF signal 104 is generated. This OVF signal 104 resets the flipflop 114, so that the serial clock 134 is brought to "1".

Since the flag 127 is "1", the output of the gate 129 is "1" and therefore, the AND gate 132 outputs "1" in response to the OVF signal 104, so that the set instruction signal 109 is brought into "1" at the same timing as the OVF signal 104. Thus, the latch 102 is set with the value "6" of the register 112 in response to the set instruction signal 109.

The flag 127 is reset with the falling edge of the OVF signals 104. Therefore, the decrementer 103 continues to decrement from the value "6", and when it reaches "0", the OVF signal 104 is generated. The flipflop 114 is set in response to the OVF signal 104, so that the serial clock 134 is brought to "1".

As seen from the above, the decrementer 103 counts "6", and therefore, the period of the serial clock 134 has a length corresponding to 15 clocks of the count clock φ 101. Accordingly, the phase deviation between the received serial data 121 and the serial clock 134 is corrected by one clock of the count clock φ 121.

Furthermore, operation will be described about a case in which the received serial data 121 remains unchanged during a half period of the serial clock 134. In this case, since the received serial data 121 remains unchanged, the flags 124, 125, 126 and 126 are not set, and therefore, the outputs of the gates 128 and 129 are "0" and the output of the gate 130 is "1".

Accordingly, when the decrementer 103 continues to decrement the content of the latch 102 and generates the OVF signal 104, the AND gate 133 outputs "1" in response to the OVF signal 104, so that the set instruction signal 110 is brought into "1" at the same timing as the OVF signal 104. Thus, the latch 102 is set with the value "7" of the register 113. Accordingly, the next half period of the serial clock 134 has a length of 8 clocks of the count clock φ 101.

Summarizing the above mentioned operation, when the received serial data 121 transits when the serial clock 134 is at "1" during a period after the latch 102 is set with a value of one of the registers until the COMP signal 107 is generated on the basis of the value set in the register 106, the next half period of the serial clock 134 becomes the value set in the register 111.

When the received serial data 121 transits when the serial clock 134 is a "1" during a period after the latch 102 is set with a value of one of the registers and after the COMP signal 107 is generated on the basis of the value set in the register 106 but before the serial clock 134 is brought "0", the next half period of the serial clock 134 becomes the value set in the register 111. In addition, since the flag 125 is not reset, a half period just after the next half period of the serial clock 134 also becomes the value set in the register 111.

When the received serial data 121 transits when the serial clock 134 is at "0" during a period after the latch 102 is set with a value of one of the registers until the COMP signal 107 is generated on the basis of the value set in the register 106, the next half period of the serial clock 134 becomes the value set in the register 112. In this case, since the flag 126 is not reset, a half period just after the next half period of the serial clock 134 also becomes the value set in the register 112.

When the received serial data 121 transits when the serial clock 134 is at "0" during a period after the latch 102 is set with a value of one of the registers and after the COMP signal 107 is generated on the basis of the value set in the register 106 but before the serial clock 134 is brought "0", the next half period of the serial clock 134 becomes the value set in the register 112.

The following is a description of the continuous operation. When the content of the latch 102 is "5", if the received serial data 121 transits, the next half period of the serial clock 134 becomes 9 clocks of the count clock φ 101. Namely, the next half period of the serial clock 134 is corrected. Here, assuming that the frequency of the received serial clock does not change, the next transition point of the received serial data 121 occurs when the value of the latch 102 is "6" and the serial clock 134 is "1". Therefore, a further next half period of the serial clock 134 becomes 9 clocks of the count clock φ 101, again. Namely, the half period of the serial clock 134 is corrected in a forward direction, again. The next transition point of the received serial data 121 occurs when the value of the latch 102 is "7" and the serial clock 134 is "1". Therefore, a next half period of the serial clock 134 becomes 9 clocks of the count clock φ 101, again, and accordingly, the half period of the serial clock 134 is corrected in the forward direction, again. But, the next transition point of the received serial data 121 occurs when the value of the latch 102 is "0" and the serial clock 134 is "0". Therefore, a next half period of the serial clock 134 becomes 7 clocks of the count clock φ 101, again, and accordingly, the half period of the serial clock 134 is corrected in a reverse direction. The next transition point of the received serial data 121 occurs again when the value of the latch 102 is "7" and the serial clock 134 is "1". Therefore, a next half period of the serial clock 134 becomes 9 clocks of the count clock φ 101, again, and accordingly, the half period of the serial clock 134 is corrected in the forward direction, again.

As explained above, when the frequency of the received serial data 101 is unchanged, the period of the generated serial clock alternately repeats the 17 clocks and 15 clocks in term of the count clock φ 101. Therefore, it is possible to generate the serial clock 134 which can surely fetch the received serial data 101.

In the above mentioned embodiment, the decrementer 103, the latch 102, the compare circuit 135, and the registers 106, 111 to 113 has a bit length of four bits. However, as mentioned above, since each of the registers is set with a value in a software manner, an arbitrary bit length (for example, eight bits) can be selected on the basis of a required maximum serial data transfer frequency and a frequency of the count clock which can be supplied.

In the above embodiment, in addition, the frequency of the count clock φ 101 is 16 times the serial data transfer frequency. However, if the frequency of the count clock φ 101 is higher than the serial data transfer frequency, a similar effect can be obtained.

Figure 4:
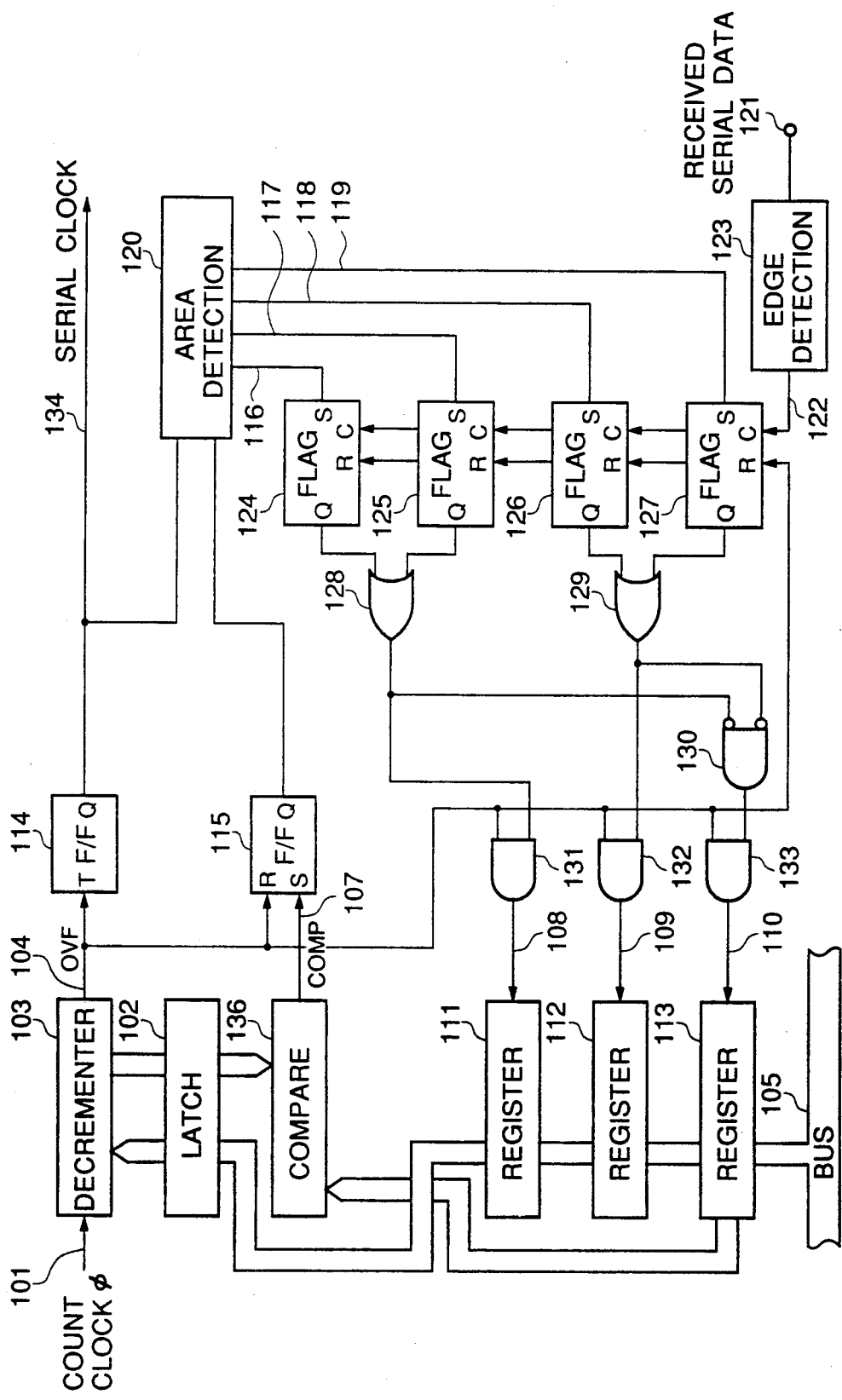
FIG. 4 is a block diagram of a second embodiment of the serial clock generating circuit in accordance with the present invention.

Referring to FIG. 4, there is shown a diagram of a second embodiment of the serial clock generating circuit in accordance with the present invention. In FIG. 4, elements similar to those shown in FIG. 1 are give the same Reference Numerals.

The shown serial clock generating circuit comprises a decrementer 103 of four bits coupled to a latch 102 for decrementing a content of the latch 102 in response to each count clock φ 101, and for generating an OVF signal 104 when the content of the latch 102 becomes "0". There are provided three registers 111, 112 and 113 of four bits, which are set through a bus 105 from an external (not shown), respectively, and which transfer and set their set value to the latch 102 in response to a set instruction signal 108, 109 or 110, respectively.

A compare circuit 136 is provided to compare more significant three bits of the set value of the register 113 with the value of the latch 102 and to generate a COMP signal 107 when the more significant three bits of the set value of the register 106 is coincident with the value of the latch 102.

A flipflop 114 receives the OVF signal 104 and performs a toggle operation in response to the OVF signal 104 so as to generate a serial clock 134. Another flipflop (F/F) 115 is set with the COMP signal 107 and reset with OVF signal 104. An output of the flipflops 114 and 115 is connected to an area detection circuit 120. This area detection circuit 120 brings its first detection signal 116 into "1" when the Q output of the flipflop 114 is at "1" and the Q output of the flipflop 115 is at "0", and also brings its second detection signal 117 into "1" when the Q output of the flipflop 114 is at "1" and the Q output of the flipflop 115 is at "1". In addition, when the Q output of the flipflop 114 is at "0" and the Q output of the flipflop 115 is at "0", the area detection circuit 120 brings its third detection signal 118 into "1", and when the Q output of the flipflop 114 is at "0" and the Q output of the flipflop 115 is at "1", the area detection circuit 120 brings its fourth detection signal 118 into "1".

The shown serial clock generating circuit also includes an edge detector 123 receiving a received serial data 121 for detecting a level change of the received serial data 121 so as to generating an edge detection signal 122. A flag 124 receives the detection signal 116 and is set in synchronism to the edge detection signal 122, and is reset in response to the OVF signal 104. A flag 125 receives the detection signal 117 and is set in synchronism to the edge detection signal 122, and is reset by counting the OVF signal 104 two times. A flag 126 receives the detection signal 118 and is also set in synchronism to the edge detection signal 122, and is reset by counting the OVF signal 104 two times. A flag 127 receives the detection signal 119 and is set in synchronism to the edge detection signal 122, and is reset in response to the OVF signal 104. Outputs of the flags 124 and 125 are inputted to an OR gate 128, and outputs of the flags 126 and 127 are inputted to an OR gate 129. Outputs of these OR gates are inputted to an AND gate 130, which generates an output signal of "1" when the output of the OR gate 128 is at "0" and the output of the OR gate 129 is at "0". An AND gate 131 receives the output of the OR gate 128 and the OVF signal 104 so as to output an logical product signal as the set instruction signal 108, and an AND gate 132 receives the output of the OR gate 129 and the OVF signal 104 so as to output an logical product signal as the set instruction signal 109. An AND gate 133 receives the output of the AND gate 130 and the OVF signal 104 so as to output an logical product signal as the set instruction signal 110.

The registers 111, 112 and 113 can be set with any value through the bus 105 in a software manner controlled by a CPU (central processing unit) (not shown) in a microcomputer of a data processing system including therein the serial clock generating circuit of the present embodiment.

As seen from comparison between FIGS. 1 and 4, the second embodiment is different from the first embodiment only in that the register 106 shown in FIG. 1 is omitted, and the compare circuit 135 coupled to the register 106 is replaced by the compare circuit 136 receiving the more significant three bits of the register 113.

Therefore, explanation is focused on the portions of the second embodiment different from the first embodiment. In the first embodiment, the point of discriminating the correction amount for correcting the phase deviation of the serial clock 134 from the received serial data 121 is given by the value set in the register 106. In the second embodiment, the discriminating point is given by the more significant three bits of the register 113. The input of the more significant three bits of the register 113 into the compare circuit 136 means that one half (½) of the value set in the register 113 is compared with the content of the latch 102. Therefore, since operation of the second embodiment is completely the same as the operation of the first embodiment when the half of the value set in the register 113 is set to the register 106, explanation of the operation of the second embodiment will be omitted. Accordingly, the second embodiment can give substantially the same operational effect as that of the first embodiment, and in addition, a step of software for setting a value to the register 106 can be omitted.

As seen from the above, even if the count clock has a fixed frequency, the serial clock generating circuit in accordance with the present invention can generate a serial clock in accordance with any one of a plurality of required transfer rates, in the extent of the maximum count number or less, by setting the values of the registers in the software manner.

Therefore, it is no longer necessary to use a plurality of quartz-crystal oscillators corresponding to a plurality of required transfer rates, or to use an expensive quartz-crystal oscillator having a high oscillation frequency which is a common multiple of plurality of required transfer rates. Accordingly, the serial clock generating circuit in accordance with the present invention can be effectively used in a serial transfer circuit contained in a microcomputer required to be able to perform a serial data transfer at different transfer rates.

In addition, since the correction amount for correcting the phase deviation between the received serial transfer data and the generated internal serial clock can be freely set to the registers in the software manner, it is possible to set an arbitrary correction amount.

The invention has thus been shown and described with reference to the specific embodiments. However, it should be noted that the present invention is in no way limited to the details of the illustrated structures but changes and modifications may be made within the scope of the appended claims.

We claim:

1. A serial clock generating circuit configured to frequency-divide an input clock having a frequency which is a number times a serial data transfer rate, so as to generate a serial clock in phase with a received serial data, the serial clock generating circuit comprising means receiving a serial data for detecting a level change of said received serial data and generating a level change signal, first memory means for storing a plurality of set values, means connected to said first memory means for selecting one of said plurality of set values, means receiving said set value selected by said selecting means for counting said selected set value by said input clock, second memory means for storing an arbitrary value, comparison means for comparing said value stored in said second memory means with a count value of said counting means at each one counting operation of said input clock, said comparison means generating a coincidence signal when a coincidence is obtained, means for discriminating a level change position on the basis of said level change signal and said coincidence signal and for setting a selection condition of said selecting means, and means for generating a serial clock on the basis of the result of the counting of said count means.

2. A serial clock generating circuit claimed in claim 1 wherein said first memory means includes first, second and third registers.

3. A serial clock generating circuit claimed in claim 2 wherein said second memory means is constituted of more significant bits of one of said first, second and third registers.

4. A serial clock generating circuit claimed in claim 2 wherein said second memory means includes a fourth register independently of said first, second and third registers.

5. A serial clock generating circuit configured to frequency-divide an input clock having a frequency which is a number times a serial data transfer rate, so as to generate a serial clock in phase with a received serial data, the serial clock generating circuit comprising an edge detection circuit for detecting a level change of a received serial data so as to generate a level change signal, three registers for storing different set values, a latch for latching the set value of one of said three registers, a decrementer for decrementing the value of said latch in response to each input clock, memory means for holding an arbitrary value for defining a phase deviation discrimination area, a comparison circuit for comparing the value stored in said memory means with the value of said latch at each one input clock, and for generating a coincidence signal when a coincidence is obtained, an area detection circuit for discriminating a level change position on the basis of said level change signal and the said coincidence signal so as to select one of said three registers to be set to said latch, and a flipflop coupled to said decrementer for generating a serial clock on the basis of the result of the counting of said decrementer.

* * * * *